(12) United States Patent
Boe

(10) Patent No.: US 6,442,037 B1
(45) Date of Patent: Aug. 27, 2002

(54) ADJUSTABLE EXPANSION BOARD SECURING STRUCTURE

(75) Inventor: Craig L. Boe, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/164,228

(22) Filed: Sep. 30, 1998

(51) Int. Cl.[7] .............................. H05K 7/14; H01R 13/62
(52) U.S. Cl. .................... 361/759; 361/801; 361/756; 361/684; 439/59; 439/327
(58) Field of Search .............................. 361/683, 684, 361/756, 736, 752, 726, 741, 798, 801, 802, 804, 759; 24/305, 324, 457, 477, 505, 538; 49/449, 456; 439/59, 61, 62, 327, 328

(56) References Cited

U.S. PATENT DOCUMENTS

| | | | |
|---|---|---|---|
| 5,317,483 A | 5/1994 | Swindler | 361/801 |
| 5,383,793 A * | 1/1995 | Hsu et al. | 361/801 |
| 5,535,100 A | 7/1996 | Lubahn et al. | 361/801 |
| 5,603,628 A | 2/1997 | Schapiro, Jr. | 439/327 |
| 5,708,563 A * | 1/1998 | Cranston, III et al. | 361/683 |
| 5,715,146 A | 2/1998 | Hoppal | 361/796 |
| 5,754,406 A | 5/1998 | Hardt et al. | 361/756 |
| 5,757,618 A | 5/1998 | Lee | 361/686 |
| 5,781,414 A | 7/1998 | Mills et al. | 361/786 |
| 5,822,193 A * | 10/1998 | Summers et al. | 361/759 |

* cited by examiner

Primary Examiner—Lynn D. Feild
(74) Attorney, Agent, or Firm—Perkins Coie LLP

(57) ABSTRACT

The invention provides for an apparatus that secures one or more expansion boards to a motherboard. A single type of adjustable retention block can be used to engage and secure expansion boards of various sizes. The retention block secures an expansion board in a groove of the retention block along the edge of the expansion board. By this attachment, the retention block avoids contact with the electrical components of either the expansion board or the motherboard.

44 Claims, 6 Drawing Sheets

Insert an expansion board into a slot on a computer motherboard

Adjust the position of a retention block so that a nose of the retention block interfaces with the expansion board and a base of the retention block is in position to be attached with a fastener Attach the base of a retention block to a support member with a fastener

Fig. 5

ADJUSTABLE EXPANSION BOARD SECURING STRUCTURE

TECHNICAL FIELD

The present invention is directed toward an apparatus and method for securing one or more expansion boards of a computer.

BACKGROUND OF THE INVENTION

The functionality of computers is enhanced by including the ability to accept peripheral systems into the computer. One of the primary means of providing added functionality is to include slots into which additional "expansion boards" can simply be inserted. It is a standard practice in the art of computer design to provide for the mounting of expansion boards perpendicular to a main computer board or "motherboard." Graphics cards, sound cards, video cards, and modem cards are typical expansion boards.

Because expansion boards are not soldered into place on the motherboard, it is possible that the boards will become dislodged, lose electrical connectivity, and cease to function properly. A number of designs have been proposed to adequately secure expansion boards to the motherboard. The standard configuration uses one screw per expansion board to secure one side of a mounting plate to the chassis of a computer. The mounting plate is secured to the expansion board. The other end of the mounting plate is inserted into a slot in the chassis. The expansion board is thus fastened relative to one wall of the computer chassis. This design assumes that the chassis is adequately stiff to prevent the motherboard, which is attached to one wall of the chassis, and the expansion board, which is attached to a second wall of the chassis, from moving relative to one another.

It has become evident to those skilled in the art that an expansion board may still become dislodged from the motherboard even though fastened to one side of the computer chassis. Expansion boards are particularly susceptible to becoming dislodged when the board is located away from a wall of the chassis. When a board is located away from the wall of the chassis, that is, near the middle of the computer box, there is a lack of lateral stiffness in the wall of the chassis to which the motherboard is connected. Therefore, flexing of the chassis wall to which the motherboard is connected causes relative movement between the motherboard and the expansion board. Consequently, shaking of the computer or flexing of the chassis during shipping or handling can result in disconnection of expansion boards from the motherboard. Disconnection is also possible with computers used in non-stationary applications.

It can be a major inconvenience to a computer user when an expansion board is dislodged. For a user unfamiliar with the symptoms of the problem, it appears that the computer is materially defective. Even after the problem is identified, it is inconvenient and time consuming to partially disassemble the computer and re-seat the expansion boards. The superior alternative is to prevent the expansion boards from ever becoming dislodged from the motherboard.

The problem of expansion type boards becoming unseated has been addressed by the prior art. For example, in U.S. Pat. No. 5,603,628 a pair of straps is used to hold a circuit board in a connector slot. A problem with the '628 patent design is that the straps pass over and through the components of the board. Therefore, there is a possibility of damage to the board and the components of a board during installation or adjustment of the straps. Additionally, the '628 patent requires that connection anchors be added to the connector slot. The anchors not only broaden the connector slot and consume motherboard area, but also require special manufacturing.

The specific problem of expansion board retention in a personal computer was addressed in U.S. Pat. No. 5,715,146. However, the '146 patent requires separate size adapter members to adequately secure expansion boards of differing heights. For each height of expansion board, a different size adapter must be added to the post member that supports the board. With different size adapters, production costs are increased and the possibility of manufacturing errors increases.

The prior art fails to provide an economical expansion board retention system that does not interfere with the components of the expansion board or consume motherboard area. Under the prior art, numerous adapters of varying sizes may be required to compensate for the fact that expansion board cards are not uniform in height. Consequently, there is a need for an apparatus and method that adequately secures expansion boards to a motherboard without interfering with the components of the expansion board or the components of the motherboard. An improved apparatus would reduce the number of parts required to effect stabilization of the expansion boards.

SUMMARY OF THE INVENTION

One embodiment of the invention is a retention block for securing an expansion board. The embodiment has a base with a fastener groove for accepting a fastener and a nose opposite to the base for securing the expansion board.

Another embodiment of the invention is a computer system comprising: a chassis; a support rail coupled to the chassis; a fastener interfacing with the support rail; a retention block coupled to the fastener including a base with a fastener groove for accepting the fastener and a nose at the opposite end of the retention block from the base; and an expansion board interfacing with the nose of the retention block, the expansion board being secured relative to the chassis to prevent electrical disconnection of the expansion board.

Still another embodiment of the invention is a method of manufacturing a computer system comprising the acts of: inserting an expansion board into a slot on a computer motherboard; adjusting the position of the retention block so that the nose of the retention block interfaces with the expansion board; and attaching the base of a retention block to a support member with a fastener.

BRIEF DESCRIPTION OF THE DRAWINGS

FIG. 5 is a flowchart illustrating a method of manufacturing a computer.

DETAILED DESCRIPTION OF THE INVENTION

Embodiments of the present invention are directed toward a computer system with a retention block and supporting structure capable of securing an expansion board such as a peripheral component interconnect (PCI) expansion board to a motherboard. By use of embodiments of the invention, expansion boards are prevented from disengaging from the motherboard. An expansion board that disengages from the motherboard loses electrical connectivity and becomes inoperative.

DESCRIPTION OF AN EMBODIMENT OF THE RETENTION BLOCK

Figure 1:
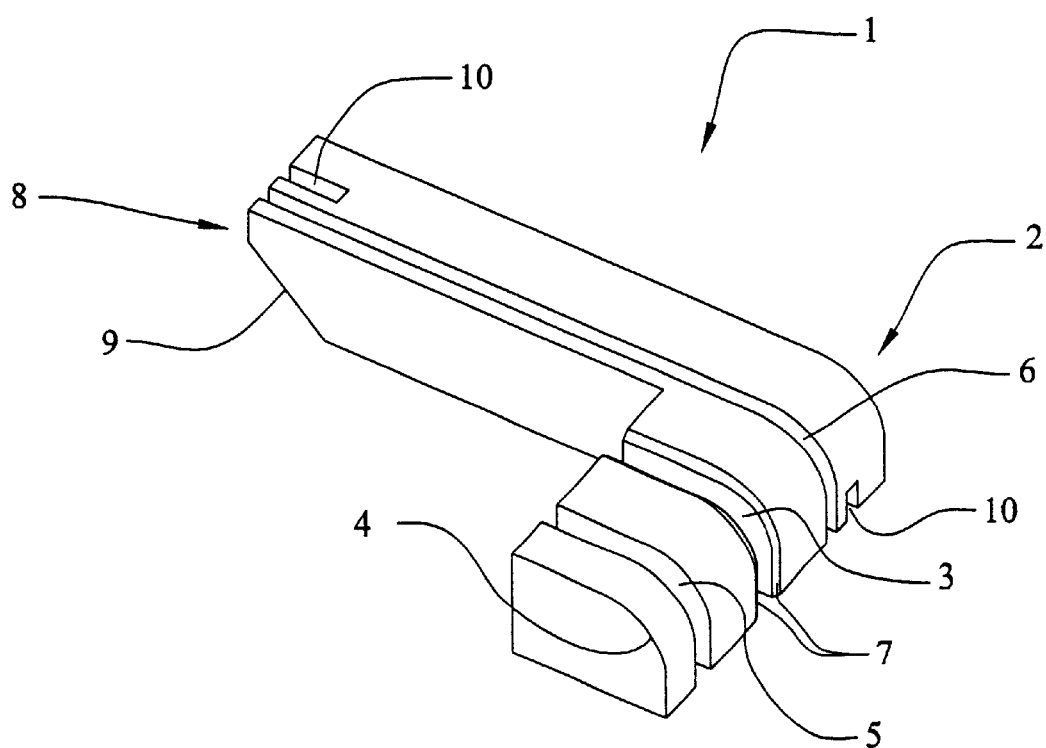
FIG. 1 is a perspective view of a retention block.
Figure 2:
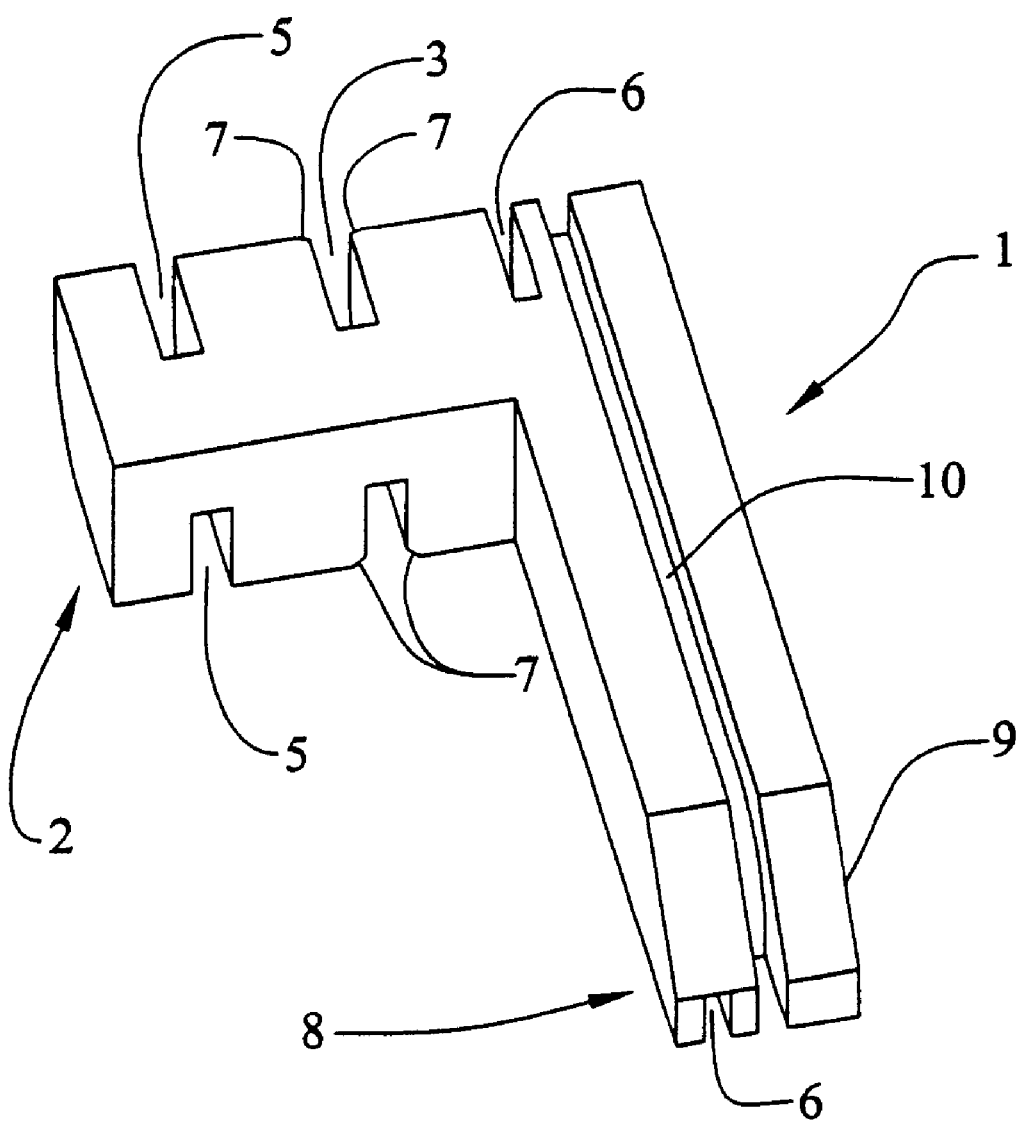
FIG. 2 is an alternative perspective view of a retention block.

FIGS. 1 and 2 show a retention block 1 that is used to secure an expansion board in an embodiment of the invention. In one embodiment, the retention block 1 is composed of a plastic having a minimum flame rating of 94V-2 such as Geon Co., type M3750 or 87241, or a polycarbonate material.

Base

As illustrated in FIGS. 1 and 2, a base 2 of the retention block 1 has a fastener groove 3 for accepting a fastener. The base 2 designates an end of the retention block 1. In an embodiment of the invention, a radius 4 is greater than twenty percent of the thickness of the retention block 1. In addition, the base 2 is formed to have a plurality of grooves such as first groove 5 and second groove 6. First groove 5 and second groove 6 receive a portion of a support structure employed to support the retention block 1. The fastener groove 3 may have chamfered edges 7 as shown in FIGS. 1 and 2.

Nose

The nose 8 of the retention block 1 is on the opposite side of the retention block 1 from the base 2. An embodiment of the invention has a chamfer 9 that has a length greater than twenty percent of the thickness of the retention block 1. Another embodiment of the invention may have a rounded edge (not shown) rather than a chamfered edge as shown. As illustrated in FIGS. 1 and 2, there is a board groove 10 through the nose 8 for receiving a portion of the expansion board to be secured. Note that board groove 10 as well as second groove 6 may extend between the base 2 and the nose 8.

Description of an Embodiment of the Computer System

Figure 3:
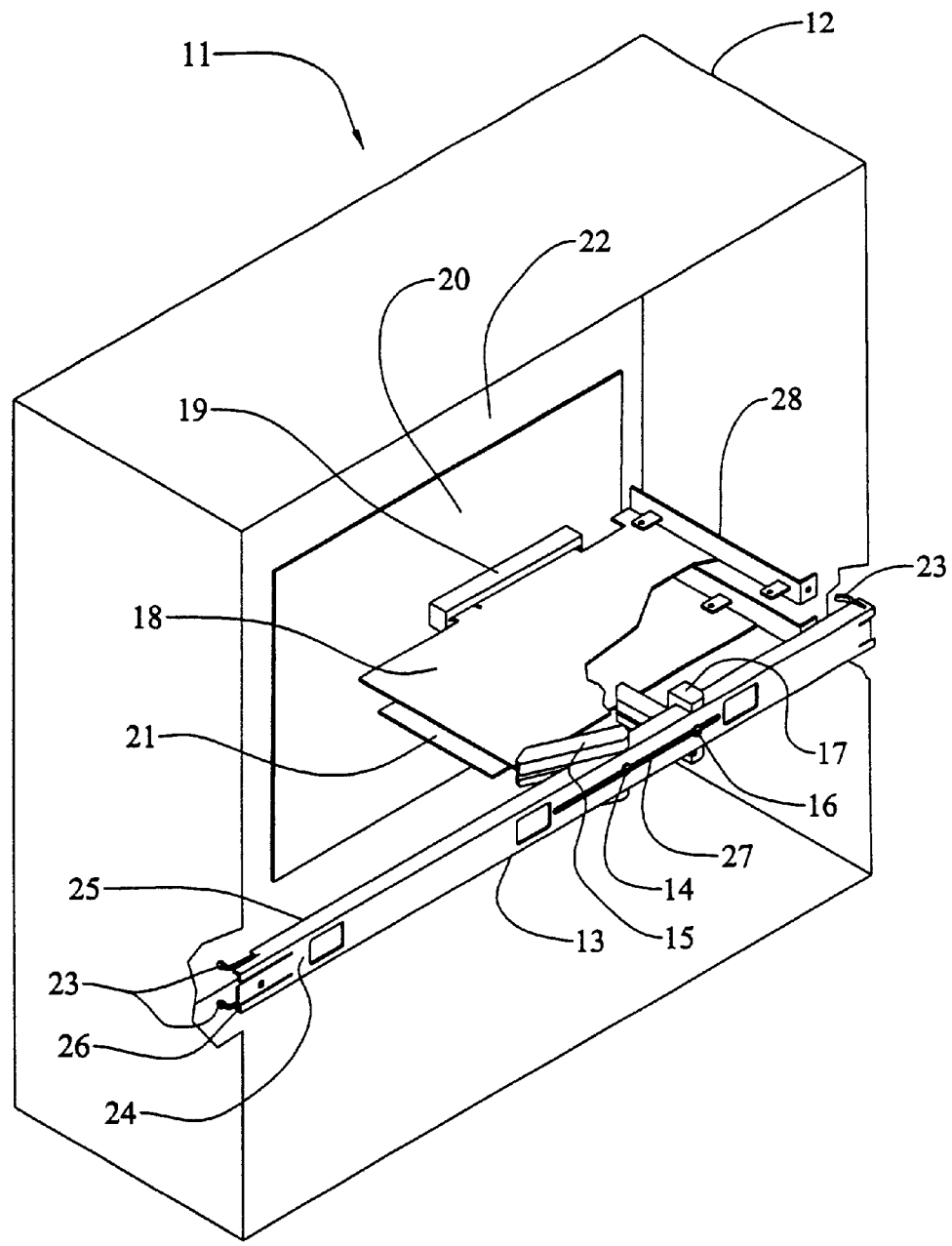
FIG. 3 is a top perspective view of a computer system with portions of the chassis and components of the computer system removed to show securing of expansion boards.
Figure 4:
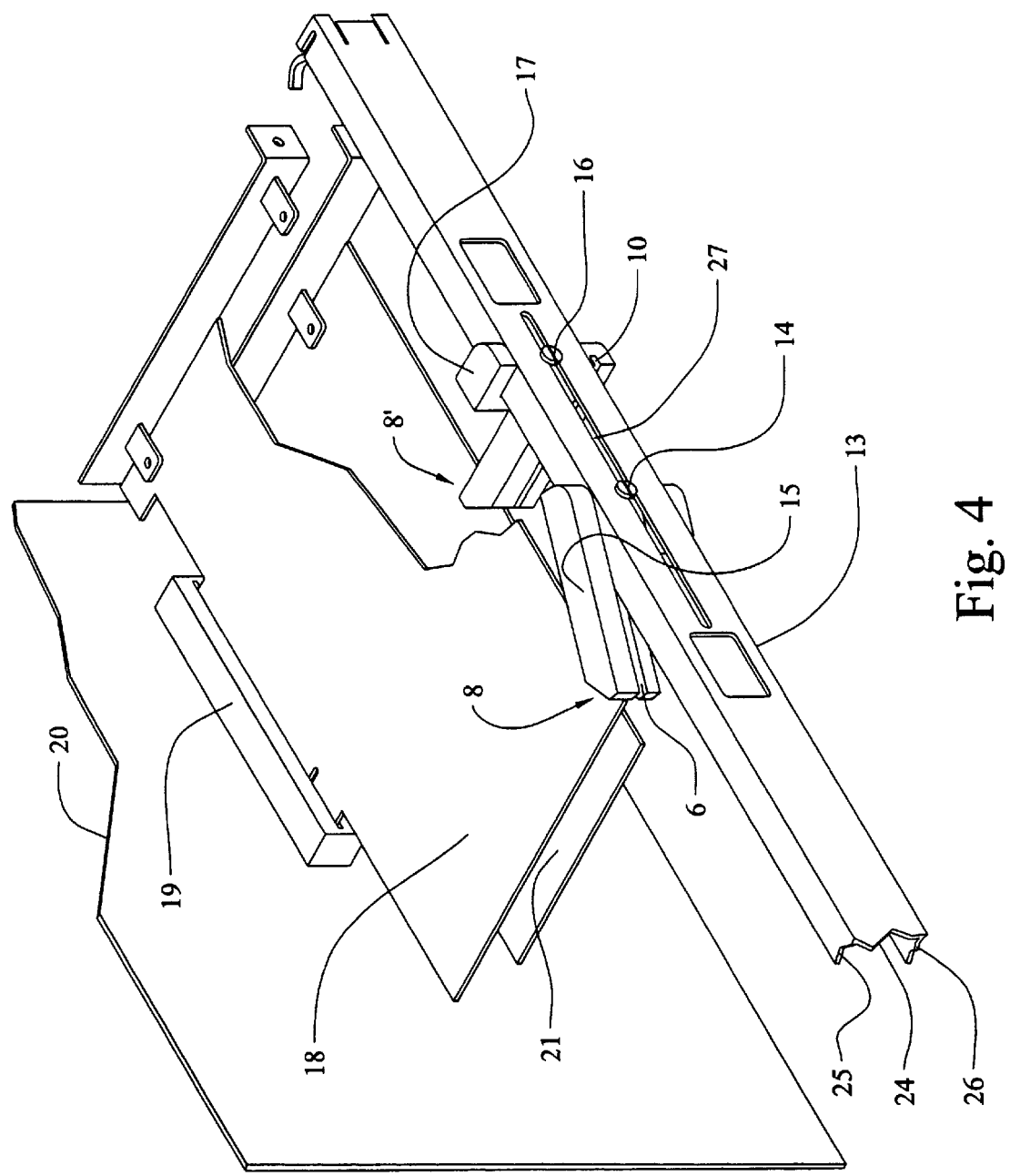
FIG. 4 is an enlarged top perspective view of components of the computer shown in FIG. 3.

FIG. 3 shows a computer system 11 with a chassis 12 that is coupled to a support rail 13 that in turn interfaces with a first fastener 14 and is coupled to a first retention block 15. Similarly, a second fastener 16 interfaces with the support rail 13 and is coupled to a second retention block 17. As shown in FIG. 4, a first nose 8 of the first retention block 15 interfaces with a first expansion board 18 to secure the first expansion board 18 relative to the chassis 12 to prevent electrical disconnection of the first expansion board 18 from a slot 19 in the motherboard 20. Similarly, a second nose 8' of the second retention block 17 interfaces with a second expansion board 21 to prevent electrical disconnection of the second expansion board 21 from a slot (not shown) in the motherboard 20. Note that various components of a typical computer system are omitted from the drawings showing the computer system 11 to provide a clearer representation of the components illustrated.

Chassis

The chassis 12 shown in FIG. 3 is shown with one wall removed and with the connection areas for the support rail 13 cut away for clarity. The chassis shown is a chassis for a tower configuration computer; however, embodiments of the invention work equivalently for other computer configurations. The motherboard 20 is connected to a wall 22 of the chassis 12.

Support Rail & Fasteners

The support rail 13 is coupled to the chassis 12. In the embodiment illustrated, the support rail 13 snaps into the chassis 12 through snap-in connectors 23. The support rail 13 shown in FIGS. 3 and 4 is a channel member with a web 24, an upper flange 25 and a lower flanges 26. Other structural shapes would be equally well-suited to provide support. The support rail 13 has a connection slot 27 through which fasteners 14 and 16 interface with the support rail 13 and couple to the retention blocks 15 and 17. The function of the connection slot 27 could be equivalently accomplished within the claims of the invention by a plurality of holes in the support rail 13, or by other equivalent structures. Fasteners 14 and 16 are screws in the embodiment illustrated in FIGS. 3 and 4.

Retention Blocks

The first retention block 15 and the second retention block 17 are geometrically and compositionally as described in the description of the first embodiment above.

Referring now to FIGS. 1, 2, and 4, first retention block 15 is coupled to the fastener 14 through the fastener groove 3 in the base 2 of the first retention block 15. Note that the retention block 1 is represented in FIGS. 3 and 4 as first retention block 15 and second retention block 17 to distinguish the alternative orientations of the retention block 1. At the orientation of first retention block 15 shown in FIG. 4, the second groove 6 in the first retention block 15 is engaged with the upper flange 25 of the support rail 13 through approximately one half of the length of the second groove 6. Similarly, though obstructed from view, the first groove 5 is engaged with the lower flange 26. The nose 8 of the first retention block 15 is shown interfacing with the first expansion board 18 through board groove 10 of first retention block 15.

The coupling of the fastener 16 to the second retention block 17 is similar to the coupling described immediately above except that the second retention block 17 is rotated 180 degrees about its longitudinal axis to interface with the second expansion board 21. In this orientation, the second grove 6 is engaged with the lower flange 26 of the support rail 13 in the area of the base 2. The first groove 5 is engaged with the upper flange 25. The interface of the nose 8' of the second retention block 17 is similar to the interface described with the first retention block but at a different angle relative to the expansion board. This results from the fact that the second expansion board 21 is not as tall as the first expansion board 18. Height of the expansion boards for the purpose of discussion of the invention will be referred to as the dimension perpendicular to the motherboard. As illustrated above, a single size and shape retention block can be used to secure expansion boards of different heights by. alternatively positioning the retention blocks.

Expansion Boards

Referring now to FIGS. 3 and 4, the first expansion board 18 interfaces with the nose 8 of the first retention block 15 as described above. A portion of the first expansion board 18 is shown cut away to provide illustration of the second expansion board 18 and the second retention block 17. In an embodiment of the invention, the first expansion board 18 and the second expansion board 21 may be PCI expansion boards.

The first retention block 15 is positioned to interface with the first expansion board 18 to prevent electrical disconnection of the first expansion board 18 from the slot 19 in the motherboard 20. With the embodiment shown, not only is the first expansion board 18 connected by conventional means with a mounting plate 28 connected to the chassis 12, but the first retention block 15 interfaces with the first expansion board 18 as described above. The invention thus provides additional stabilization to the electrical connection between the first expansion board 18 and the slot 19.

The second expansion board 21 is an expansion board of less height than the first expansion board 18, but as illustrated can be secured by a retention block of the same design as the first retention board with an embodiment of the present invention.

Method of Manufacturing with an Embodiment of the Invention

One embodiment of the invention is a method of manufacturing a computer system. The method, which is shown in FIG. 5, may be accomplished using a retention block 1 as described above. As a first act, an expansion board is inserted into a slot of a computer motherboard. In an embodiment of the invention, the act of inserting an expansion board includes inserting a PCI expansion board. With the expansion board in place, a retention block is adjusted to a position so that a nose of the retention block interfaces with the expansion board and a base of the retention block is in position to be attached with a fastener. The act of adjusting the position of the retention block may include adjusting the position of the retention block so that a board groove in the retention block engages at least a part of the expansion board. Finally, a fastener is used to attach the base of a retention block to a support member. The act of attaching to the base of the retention block may include the act of turning a screw. Methods of attaching to the base such as clipping, pinning, clamping, and others would be adequate and are contemplated by the invention.

Figure 6:
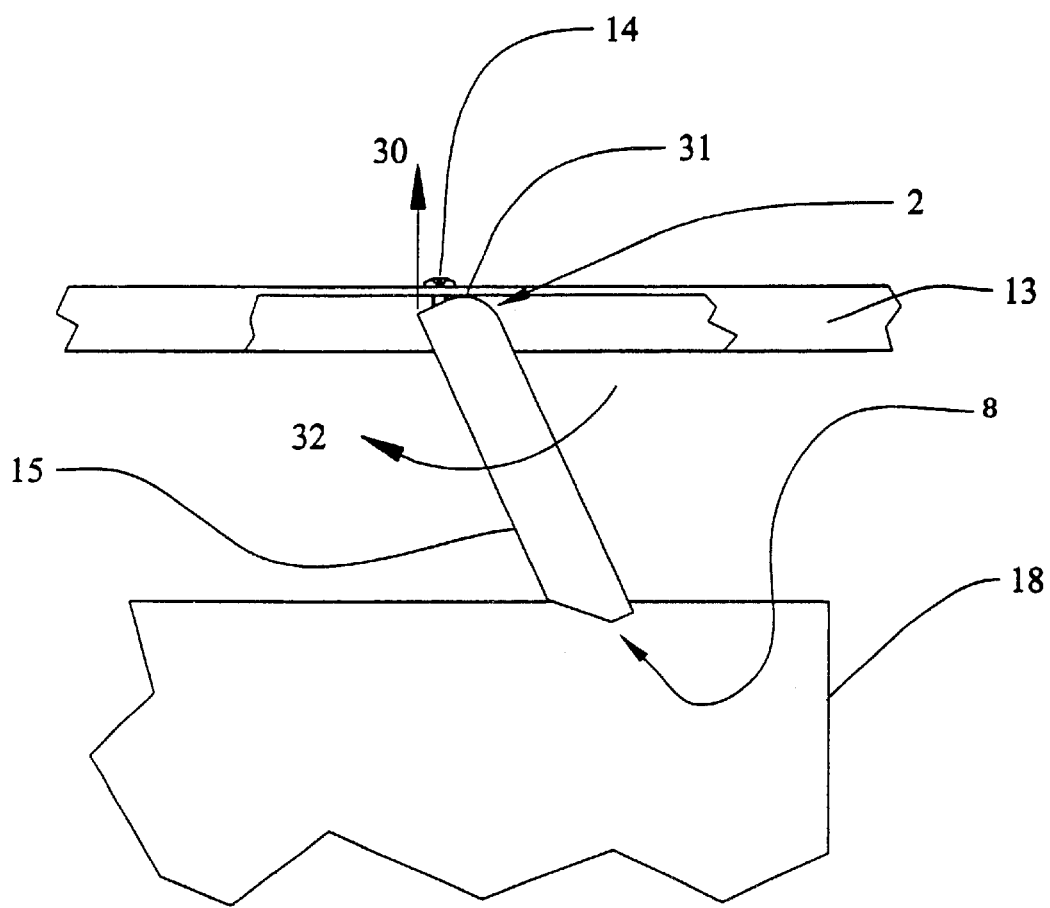
FIG. 6 is a side elevation view of an embodiment of the invention showing a method of manufacturing a computer.

FIG. 6 shows the nose 8, of a retention block 15 engaged with an expansion board 18. A base 2 of the retention block 15 is attached to a support rail 13 with a fastener 14. Portions of the support rail 13 are cut away for clarity. By tightening the fastener 14, the retention block 15 is pulled toward the fastener 14 in the direction labeled 30 in FIG. 6. Because the retention block 15 contacts the support rail 13 along an area 31 and the support rail cannot be pulled further toward the fastener along that area, the base 2 of the retention block 15 rotates about area 31. The direction of rotation is shown as 32 in FIG. 6. When the retention block 15 is rotated, the nose 4 of the retention block transmits a load to the expansion board 18.

The transmitted load acts to preload the interface between the retention block 15 and the expansion board 18 and thereby to prevent disengagement of the expansion board from its expansion slot. Therefore, in the embodiment described, tightening the fastener 14 enhances the security of the expansion board 18.

From the foregoing it will be appreciated that, although specific embodiments of the invention have been described herein for purposes of illustration, various modification may be made without deviating from the spirit and scope of the invention. Accordingly, the invention is not limited except as by the claims.

ADVANTAGES OF THE INVENTION

An advantage of the present invention is that expansion boards of an infinite number of heights, within the range of rotation of the retention block, can be secured by a single type of retention block. To adjust a retention block to secure boards of various sizes an operator merely rotates the block to the desired position and fastens the block with a screw. The invention therefore provides for increased efficiencies in the ordering of parts and in the manufacturing of computers. Additionally, the possibility of manufacturing errors due to erroneous part selection by manufacturing operators is reduced.

Another advantage of the invention is that it provides for expansion board retention without interfering with the components of either the motherboard or the expansion board. The retention block does not engage the motherboard in any way and only contacts the expansion board along an edge of the board where components can be avoided.

Yet another advantage of an embodiment of the invention is that the geometry of the retention block is such that when a fastener is attached to the base of the retention block, the tightened fastener preloads the interface between the nose of the retention block and the expansion board.

What is claimed is:

1. A retention block for securing an expansion board comprising:
    a base with a fastener groove for accepting a fastener and a surface adapted to engage a support rail; and
    a nose opposite to said base for securing the expansion board;
    wherein a length of the retention block extends said base and said nose and a thickness of the retention block is perpendicular to the and parallel with the fastener groove.

2. The retention block of claim 1 wherein the surface of the base includes a radius greater than twenty percent of the thickness of the block.

3. The retention block of claim 1 wherein the base includes a groove for receiving a portion of a support structure.

4. The retention block of claim 1 wherein the base includes a plurality of grooves for receiving portions of a support structure.

5. The retention block of claim 1 wherein the fastener groove has chamfered edges.

6. The retention block of claim 1 wherein the nose includes a chamfer having a length greater than twenty percent of the thickness of the retention block.

7. The retention block of claim 1 wherein the nose includes a board groove for receiving a portion of the expansion board.

8. The retention block of claim 1 wherein the nose includes a groove that extends between the nose and the base for receiving a portion of a support rail.

9. A retention block for securing an expansion board comprising:
    a base with a radius greater than twenty percent of a thickness of the block with a groove for receiving a portion of a support rail, and with a fastener groove with chamfered edges for accepting a fastener; and
    a chamfered nose with a chamfer greater in length than twenty percent of the thickness of the retention block opposite to said base with a board groove that extends between the base and the nose for receiving and securing the expansion board;
    wherein a length of the retention block extends between said base and said chamfered nose and the thickness of the retention block is perpendicular to the length and parallel with the fastener groove.

10. A computer system comprising:
a chassis;
a support rail coupled to said chassis;
a fastener interfacing with said support rail, the fastener comprising a screw;
a retention block coupled to said fastener and rotatable with respect to said support rail, the retention block including a base with a fastener groove for accepting said fastener and a nose at the opposite end of said retention block from the base; and
an expansion board interfacing with the nose of said retention block, said expansion board thus being secured relative to said chassis to prevent electrical disconnection of said expansion board;
wherein a length of the retention block extends between the base and the nose and a thickness of the retention block is perpendicular to the length and parallel with the fastener groove.

11. The computer system of claim 10 wherein said chassis is the chassis of a tower configuration computer.

12. The computer system of claim 10 wherein said support rail has a channel shaped cross section with two flanges and a web.

13. The computer system of claim 10 wherein said retention block has a base with a radius greater than twenty percent of the thickness of the block, a groove for receiving a portion of said support rail, a fastener groove with chamfered edges for accepting a fastener, and a chamfered nose with a chamfer greater in length than twenty percent of the thickness of the retention block opposite to said base with a board groove that extends between the base and the nose for receiving and securing the expansion board.

14. The computer system of claim 10 wherein said expansion board is a PCI expansion board.

15. A method of manufacturing a computer system comprising the acts of:
inserting an expansion board into a slot on a computer motherboard;
adjusting the position of the retention block so that a nose of the retention block interfaces with the expansion board and a base of the retention block is in position to contact a support; and
attaching the base of the retention block to the support with a fastener, attaching the base including the act of turning a screw.

16. The method of claim 15 wherein the act of inserting an expansion board includes inserting a PCI expansion board.

17. The method of claim 15 wherein the act of adjusting the position of the retention block includes adjusting the position of the retention block so that a board groove in the retention block engages at least a portion of the expansion board.

18. The method of claim 15 wherein the act of attaching the base of the retention block includes the act of attaching a fastener to the base of the retention block, the fastener when tightened acting to pull the retention block toward the fastener and causing the retention block to rotate about an area on the base of the retention block and thereby causing the nose of the retention block to transmit a load to the expansion board.

19. A retention block for securing an expansion board, comprising:
a nose adapted to engage an expansion board; and
a base spaced from the nose by a length of the retention block, the base having a fastener groove and a curved surface adapted to contact an area of a support, the curved surface being spaced from the nose and inducing rotation of the nose toward the expansion board to transmit a load to the expansion board as a fastener is tightened within the expansion groove.

20. The retention block of claim 19 wherein the nose includes a board groove adapted to receive a portion of the expansion board.

21. The retention block of claim 19 wherein the curved surface has a radius greater than twenty percent of a thickness of the block.

22. The retention block of claim 19 wherein the base includes a groove for receiving a portion of the support.

23. The retention block of claim 19 wherein the base includes a plurality of grooves for receiving portions of the support.

24. The retention block of claim 19 wherein the nose includes a groove for receiving a portion of the support.

25. A computer system comprising:
a chassis;
a support coupled to the chassis;
a retention block including a base and a nose, the base having a curved surface engaging the support, the nose being spaced from the base by a length of the retention block;
an expansion board; and
a fastener engaging the support and received in the base at a location with respect to the curved surface adapted to induce rotation of the nose toward the expansion board to transmit a load to the expansion board as the fastener is tightened.

26. The computer system of claim 25 wherein the fastener is a screw.

27. The computer system of claim 25 wherein the retention block base includes a fastener groove adapted to receive the fastener.

28. The computer system of claim 25 wherein the nose of the retention block includes a board groove for receiving an edge of the expansion board.

29. The computer system of claim 25 wherein the curved surface of the retention block base has a radius greater than twenty percent of a thickness of the block.

30. The computer system of claim 25 wherein the retention block base includes a groove for receiving a portion of the support.

31. The computer system of claim 25 wherein the retention block base includes a plurality of grooves for receiving portions of the support.

32. The computer system of claim 25 wherein the nose includes a groove for receiving a portion of the support.

33. The computer system of claim 25 wherein the support comprises a support rail having a flange, the retention block base including a groove for receiving the flange.

34. The computer system of claim 33 wherein the nose includes a groove for receiving the flange of the support.

35. The computer system of claim 34 wherein the nose also includes a board groove for receiving an edge of the expansion board.

36. The computer system of claim 25 wherein the support comprises a support rail having a pair of spaced-apart flanges, the retention block base including a pair of grooves for receiving the flanges.

37. A method of manufacturing a computer system comprising the acts of:
inserting an expansion board into a slot on a computer motherboard;

positioning a retention block with respect to the expansion board and a support carried by a computer chassis so that a nose of the retention block interfaces with the expansion board;

attaching a fastener to a base of the retention block and tightening the fastener, tightening of the fastener rotating the entire retention block about an area of the base in contact with the support and transmitting a load from the nose of the retention block to the expansion board.

38. A retention block for securing an expansion board comprising:

a base with a fastener groove for accepting a fastener and a groove for receiving a portion of a support structure; and a nose opposite to said base for securing the expansion board;

wherein a length of the retention block extends between said base and said nose and a thickness of the retention block is perpendicular to the length and parallel with the fastener groove.

39. The retention block of claim 38 wherein the base includes a plurality of grooves for receiving portions of the support structure.

40. A retention block for securing an expansion board comprising:

a base with a fastener groove for accepting a fastener; and a nose opposite to said base for securing the expansion board, the nose including a groove for receiving a portion of a support rail;

wherein a length of the retention block extends between said base and said nose and a thickness of the retention block is perpendicular to the length and parallel with the fastener groove.

41. A computer system comprising:

a chassis;

a support rail coupled to said chassis;

a fastener interfacing with said support rail;

a retention block coupled to said fastener including a base and a chamfered nose at the opposite end of said retention block from the base, the base including a fastener groove for accepting said fastener, a radius greater than twenty percent of the thickness of the block, a groove for receiving a portion of said support rail, the nose having a chamfer greater in length than twenty percent of a thickness of the retention block opposite to said base, the nose including a board groove that extends between the base and the nose for receiving and securing the expansion board; and an expansion board interfacing with the nose of said retention block, said expansion board thus being secured relative to said chassis to prevent electrical disconnection of said expansion board wherein a length of the retention block extends between the base and the nose and a thickness of the retention block is perpendicular to the length and parallel with the fastener groove.

42. A method of manufacturing a computer system comprising the acts of:

inserting an expansion board into a slot on a computer motherboard;

adjusting the position of the retention block so that a nose of the retention block interfaces with the expansion board and a base of the retention block is in position to be attached with a fastener; and attaching the base of a retention block to a support member by turning a screw.

43. A method of manufacturing a computer system comprising the acts of:

inserting an expansion board into a slot on a computer motherboard;

adjusting the position of the retention block so that a nose of the retention block interfaces with the expansion board and a base of the retention block is in position to be attached with a fastener; and attaching the base of a retention block to a support member by attaching a fastener to the base of the retention block, the fastener when tightened acting to pull the retention block toward the fastener and causing the retention block to rotate about an area on the base of the retention block and thereby causing the nose of the retention block to transmit a load to the expansion board.

44. A computer system comprising:

a chassis;

a support rail coupled to said chassis;

a fastener interfacing with said support rail, the fastener comprising a screw;

a retention block coupled to said fastener and rotatable with respect to said support rail, the retention block including a base with a radius greater than twenty percent of a thickness of the retention block, a groove for receiving a portion of the support rail, a fastener groove with chamfered edges for accepting a fastener, and a chamfered nose at the opposite end of said retention block from the base, the nose having a chamfer greater in length than twenty percent of the thickness of the block opposite to the base with a board groove that extends between the base and the nose; and an expansion board interfacing with the board groove of the retention block, said expansion board thus being secured relative to said chassis to prevent electrical disconnection of said expansion board;

wherein a length of the retention block extends between the base and the nose and a thickness of the retention block is perpendicular to the length and parallel with the fastener groove.

* * * * *